United States Patent [19]

Griess

[11] 4,156,280

[45] May 22, 1979

[54] UTILITY MONITOR FOR DETECTING AND STORING POWER LINE DISTURBANCES

[75] Inventor: Roy K. Griess, Wappingers Falls, N.Y.

[73] Assignee: International Business Machines Corporation, Armonk, N.Y.

[21] Appl. No.: 751,575

[22] Filed: Dec. 17, 1976

[51] Int. Cl.$^2$ .......................................... G01R 19/30
[52] U.S. Cl. .................................. 364/481; 307/354; 340/691; 361/90; 364/550
[58] Field of Search ................ 364/481; 340/657–663; 361/90–92, 111; 307/351–354; 324/103 P

[56] References Cited

U.S. PATENT DOCUMENTS

| | | | |
|---|---|---|---|
| 3,813,667 | 5/1974 | Smith | 361/90 |
| 3,836,790 | 9/1974 | Becker | 361/90 |
| 3,973,197 | 8/1976 | Meyer | 324/103 P |
| 4,006,413 | 2/1977 | Silberberg | 324/103 P |
| 4,069,452 | 1/1978 | Conway et al. | 307/351 |

OTHER PUBLICATIONS

Chambers et al., Digital Peak Detecting and Ripple Testing Device, IBM Tech Disclosere Bull. vol. 17, No. 7, Dec. 1974.

Primary Examiner—Felix D. Gruber
Attorney, Agent, or Firm—Harold H. Sweeney, Jr.

[57] ABSTRACT

A utility monitor for detecting and storing power line disturbances is provided which includes peak-voltage sensing means for over-voltages which provides an interrupt signal at the time of a strobe pulse indicative of a voltage rise above a preset threshold and which removes the interrupt signal when said peak voltage drops a preselected amount below the preset threshold value. A peak-voltage sensing means for under-voltages is also included for obtaining an interrupt output at the time of said strobe pulse indicative of a voltage drop below a preset threshold and for removing the interrupt output when said peak-voltage rises a preset amount above the preselected threshold value. A preselected number of cycles of said input sinewave voltage are stored before and after said interrupt.

8 Claims, 5 Drawing Figures

UTILITY MONITOR FOR DETECTING AND STORING POWER LINE DISTURBANCES

BACKGROUND OF THE INVENTION

The invention relates to a utility monitor for detecting and storing power line disturbances and, more particularly, to a utility monitor having a built-in differential between over-voltage triggering and resetting and under-voltage triggering and resetting and providing storage of a preselected number of cycles of said input sinewave voltage before and after the detected power line disturbance.

In data processing systems the machines often require checking because of some detected problem. Very often there is no obvious cause of the problem and the service man logs the call in as no-trouble-found. In many cases the utility line is suspect. Accordingly, the cause of machine problems can be traced by detecting line dips or over-voltages and storing the waveshape before and after the fact, thereby, retaining valuable diagnostic information.

A problem with high gain sensors as used in utility monitors is that they respond erratically to the fluctuation of voltages being sensed at the threshold switching point. This has become known as the threshold switching indecision. This problem has been solved in prior utility monitors by using a small amount of positive feedback around an operational amplifier, which is utilized to do the comparison between the voltage being monitored and the threshold, to introduce an offset or differential between the setting and resetting thresholds. This threshold setting and resetting differential or hysteresis, as it is called, is practical for only relatively small differentials and is not always suitable where a large set-reset differential and a variable reference are desired.

When utility monitors are used to monitor voltages of quite different values, the threshold setting must be changed accordingly. This has been previously accomplished by providing a rotary switch arrangement which is capable of selecting a number of threshold levels for operation of the utility monitor with specific voltage level inputs. Of course, a large number of threshold settings require an equally large number of rotary switch positions.

The prior art utility monitors have, in some cases, just kept track of the interrupt within a counter and subsequently compared their time of occurrence with the time of occurrence of the machine problem to determine if the problem was a utility line problem or an actual machine fault. Where it is desired to do more than just capture utility interrupts within a count, display arrangements have been provided, such as cathode ray tubes, where photographs are taken of the scope which includes the waveform before and after the interrupt. Of course, more elaborate schemes such as tape recording outputs have been provided to obtain a trace of the voltage fluctuation before and after the interrupt. These arrangements are expensive and do not lend themselves to a simple built-in utility monitor in a data processing system.

SUMMARY OF THE INVENTION

A utility monitor is provided for detecting and storing power line disturbances on a one or more phase power input line. The sine wave voltages on the power line are transformer coupled to the utility monitor. A timing means generator generates strobe pulses which are used to sample the input sinewaves at their peaks. An over-voltage, peak-voltage sensing means generates an interrupt output at the time of the strobe pulse which is indicative of a voltage rise above a preset threshold. The interrupt signal is removed when the peak voltage drops a preselected amount below the preset threshold value. Likewise, an under-voltage, peak-voltage sensing means is provided for obtaining an interrupt output at the time of the strobe pulse indicative of a voltage drop below a present threshold and removes the interrupt output when the peak-voltage rises a preselected amount above the preset threshold value. A preselected number of cycles of the input sine wave voltage are stored before and after the interrupt.

Another feature of the invention is the use of a digital-to-analog converter to set the threshold reference. This allows the reference to be easily changed to practically any value from a remote source.

It is an object of the present invention to provide an improved utility monitor for detecting and storing power line disturbances for a one or more phase input power line.

It is another object of the present invention to provide a utility monitor in which threshold indecision is prevented by providing over-voltage and under-voltage resets at preselected amounts below and above the threshold values, respectively.

It is a further object of the present invention to provide a utility monitor which simply and inexpensively stores a preselected number of cycles of the input sine wave voltage before and after the interrupt thereby providing diagnostic information.

It is yet another object of the present invention to provide a utility monitor in which the over-voltage and under-voltage threshold settings can be automatically adjusted to new settings from a remote location.

BRIEF DESCRIPTION OF THE DRAWINGS

FIG. 3 is a schematic representation showing the waveforms associated with the over-voltage, peak-voltage sensor of FIG. 2a.

DETAILED DESCRIPTION OF THE PREFERRED EMBODIMENT

Figure 1:
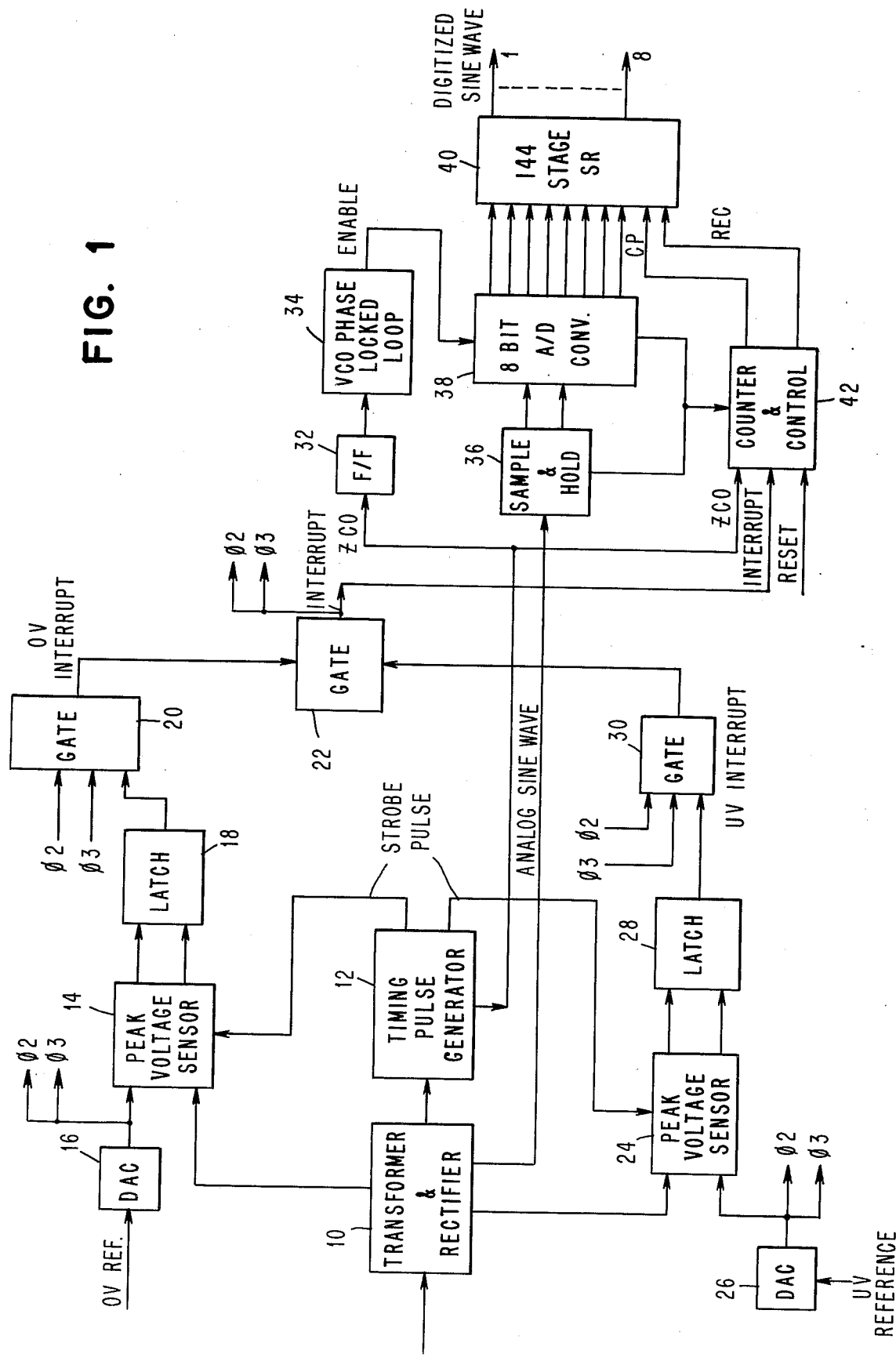
FIG. 1 is a block diagram illustrating the interconnections of one phase of a multi-phase utility monitor.

Referring to FIG. 1, there is shown a block diagram of the utility monitor for one phase of a utility line input. The arrangement, which provides the detection and storage function of an over or under-voltage, is duplicated for each phase of the multiphase input line, whereas the digital-to-analog converters (DAC represented by blocks 16 and 26 and the gates 20, 22 and 30 are common to all phases. The utility line voltage is transformer coupled to the utility monitor by a step down transformer and rectifier circuit arrangement 10. The sine wave voltages are connected to timing pulse generator 12 which generates a zero-cross-over (ZCO) pulse at the time the voltage crosses the zero axis and a strobe pulse 90° after zero-cross-over for sampling the peak-voltage in peak-voltage sensors 14 and 24. The rectified input voltage is applied to the peak-voltage sensors 14 and 24 where the peak is sampled via the 90° strobe pulse. The digital-to-analog converter 16 converts the digitized over-voltage reference to an analog voltage which is compared to the rectified voltage in peak voltage sensor 14. If the voltage is over the preset threshold or reference, the latch 18 is set which produces an over-voltage interrupt signal through gates 20 and 22. It should be noted that the gate 20 also gates the interrupt output from the latches of phases 2 and 3 of the utility monitor. An under-voltage interrupt is obtained somewhat the same way. The strobe pulse from the timing pulse generator 12 times the comparison of the rectified input voltage, from the utility line via transformer 10, with the reference set by the digital-to-analog converter (DAC) 26. When the peak-voltage input drops below the reference, latch 28 is set giving an under-voltage interrupt signal which passes through gate 30 and gate 22. Similarly, the under-voltage signal from corresponding latches of phases 2 and 3 of the utility monitor are gated through gate 30 providing an interrupt signal. Gate 22 passes these over-voltage and under-voltage interrupt signals from each phase of the multi-phase input. Each phase interrupt signal is connected from gate 22 to a respective counter and control 42 where each interrupt signal starts a counter counting up to 14. Referring again to the phase 1 arrangement shown in FIG. 1, the zero-cross-over pulses from the timing pulse generator 12 are fed to flip-flop 32 which generates a square wave equal to line frequency. The phase-lock-loop generates a square wave that is exactly 12 times the frequency of flip-flop 32. This provides the timing and, accordingly, enables the eight bit analog-to-digital converter 38 to sample the line twelve times for each cycle. The analog sine wave is obtained from transformer 10 and fed to sample and hold circuit 36. The eight bit analog-to-digital converter 38 samples the sine wave every 30°, thus, 12 times per cycle. This eight bit digital word is fed as an input to a shift register 40 which has 144 stages such that when the shift register is full a further input or the 145th input will cause the first input to shift out. The seven cycle counter of the counter and control circuit 42 is started by the receipt of an interrupt. After seven cycles, the counter output blocks the shift register clock pulse and puts the shift register in the recirculate mode so that we have five cycles of information before the interrupt and seven following the interrupt. Thus, valuable diagnostic information is stored in the shift register.

Further details on the inventive features in the above described utility monitor will be given below. Particularly, in the detailed way that the peak-voltage sensors 14 and 24 operate and, more particularly, the way the threshold indecision is removed. Also, details will be given on the combination of the digital-to-analog converter with the peak-voltage sensors 14 and 24 to set the reference when a new voltage or different voltage reference threshold is required. Some further details of the counter and control 42 as well as further details of the overall storage operation are provided in the following description of some of the pertinent circuits in the above-mentioned blocks.

Figure 2A:
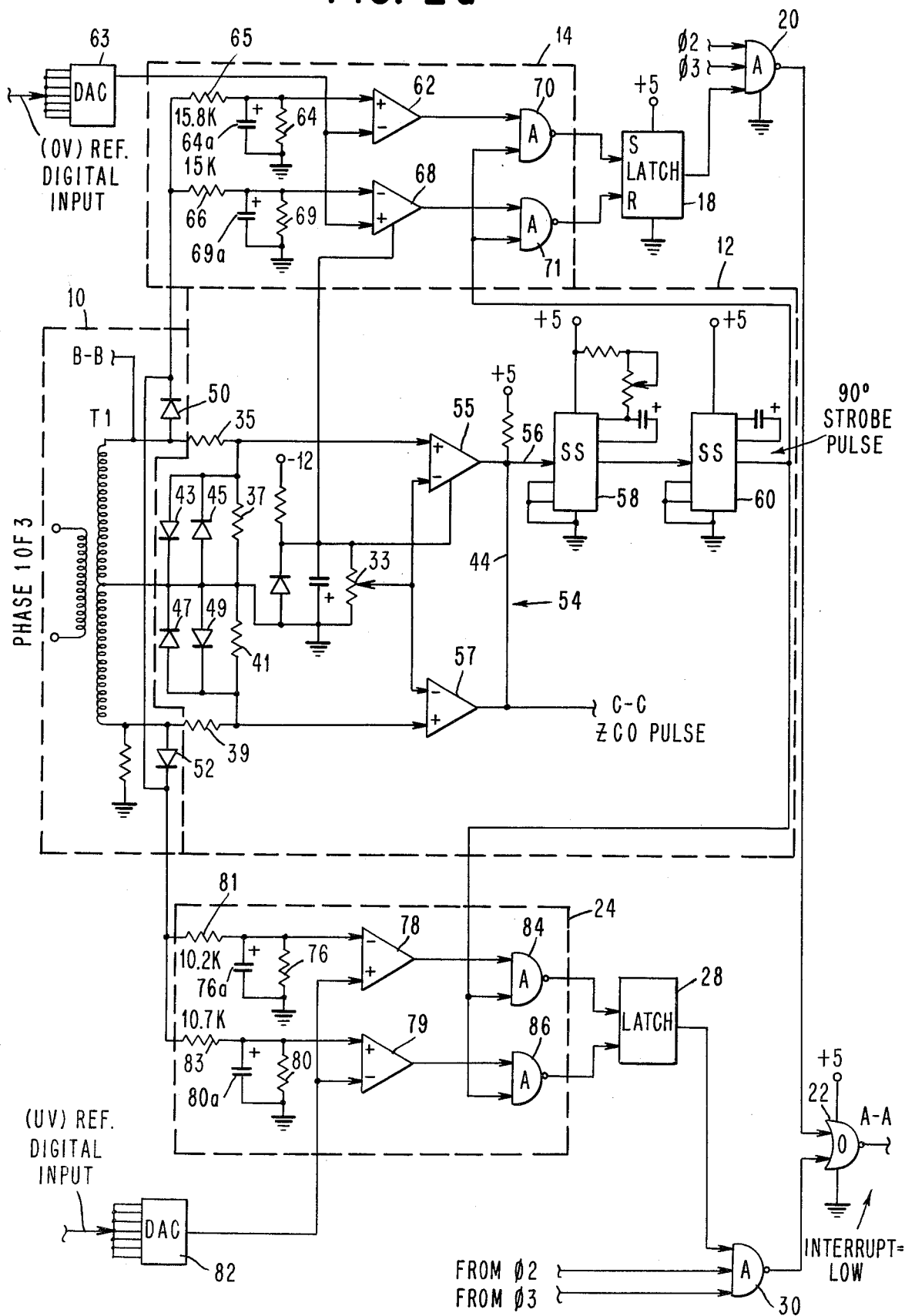
FIGS. 2a and 2b are schematic diagrams showing the blocks of the utility monitor of FIG. 1 in more detail.

Referring to FIG. 2a, phase 1 of a three phase utility line input is shown connected to the input of transformer T1. The transformer T1 steps down the voltage which is subsequently full wave rectified by diodes 50 and 52. The timing pulse generator 12 includes a zero-cross-over pulse generator 54 which generates a pulse output on output line C—C and output line 56 each time the sine wave crosses the zero axis. The zero-cross-over pulse generator consists of two high gain comparators 55 and 57, each having an invert (−) and a non-invert (+) input terminal.

The comparators 55 and 57 derive both of their (+) inputs from the center tapped transformer T1. Transformer T1 represents one phase of a three phase transformer. The inverting inputs (−) are offset from the zero volt position by a small negative voltage derived from the setting of potentiometer 33. The setting of this potentiometer 33 also sets the pulse width of the zero-cross-over pulse. The more negative the voltage established by potentiometer 33 the wider the pulse width. This small negative voltage establishes the voltage reference $V_R$ for each of the comparators 55 and 57. Resistors 35, 37, 39, 41 and diodes 43, 45, 47 and 49 divide down and clamp the transformer voltage to compatible levels. In operation, the outputs of comparators 55 and 57 are in phase with their (positive) inputs. Therefore, when the (+) inputs applied to comparators 55 and 57 are more positive then the negative reference $V_R$, the outputs are at an up-level (+5 V), and when the (+) inputs are more negative then the reference $V_R$, the outputs are at a down-level (0V). It should be noted that the comparator inputs to the (+) terminals are 180° out of phase with one another due to the transformer action. The outputs of the comparators 55 and 57 are connected together via line 44. The comparators that were utilized have an open collector transistor for outputs which causes the comparator with a down-level output to dominate. Therefore, the output on line 56 is always a down-level except at the ZCO point where the inputs to both comparators are more positive than $V_R$. At this time, a positive pulse is generated with a pulse width determined as mentioned above by the $V_R$ setting.

The zero-cross-over (ZCO) pulse produced from comparators 55 and 57 of the zero-cross-over pulse generator 54 is connected serially to a first and a second single shot circuit 58 and 60. Single shot 58 provides a delayed trigger pulse to single shot 60. The delay is selected to give a strobe pulse output from single shot 60 which occurs 90° after the zero-cross-over pulse. The strobe pulse should occur at the peak of the sinusoidal voltage input.

The over-voltage, peak-voltage sensor 14 has two comparators 62 and 68 each having an invert (−) and a non-invert (+) terminal. The operation of these comparators is such that a down level output is produced as long as the non-inverting input is more negative than the inverting input. As soon as the non-inverting input becomes more positive than the inverting input, an up-level output is produced.

Another way of looking at the operation of the pair of comparators is to consider an output, that is an up-level, being produced whenever the polarity indicated on the comparator is obtained. Comparator 62 of the peak-voltage sensor 14 has the over-voltage reference applied to its minus or inverting terminal. This over-voltage reference is obtained from a digital-to-analog converter (DAC) 63 which receives a digital input from a remote source and converts it into a voltage which serves as the threshold reference for the over-voltage, peak-voltage sensor. The other input to comparator 62 is obtained from the step-down transformer T1 and, after being full wave rectified by diodes 50 and 52 and divided down by resistors 64 and 65 is applied to the non-inverting terminal, the (+) terminal of the comparator 62. The voltage level of the signal is determined by the value of the precision resistor-divider-network 64 and 65. Capacitors 64a and 69a filter out high frequency noise.

Figure 3:
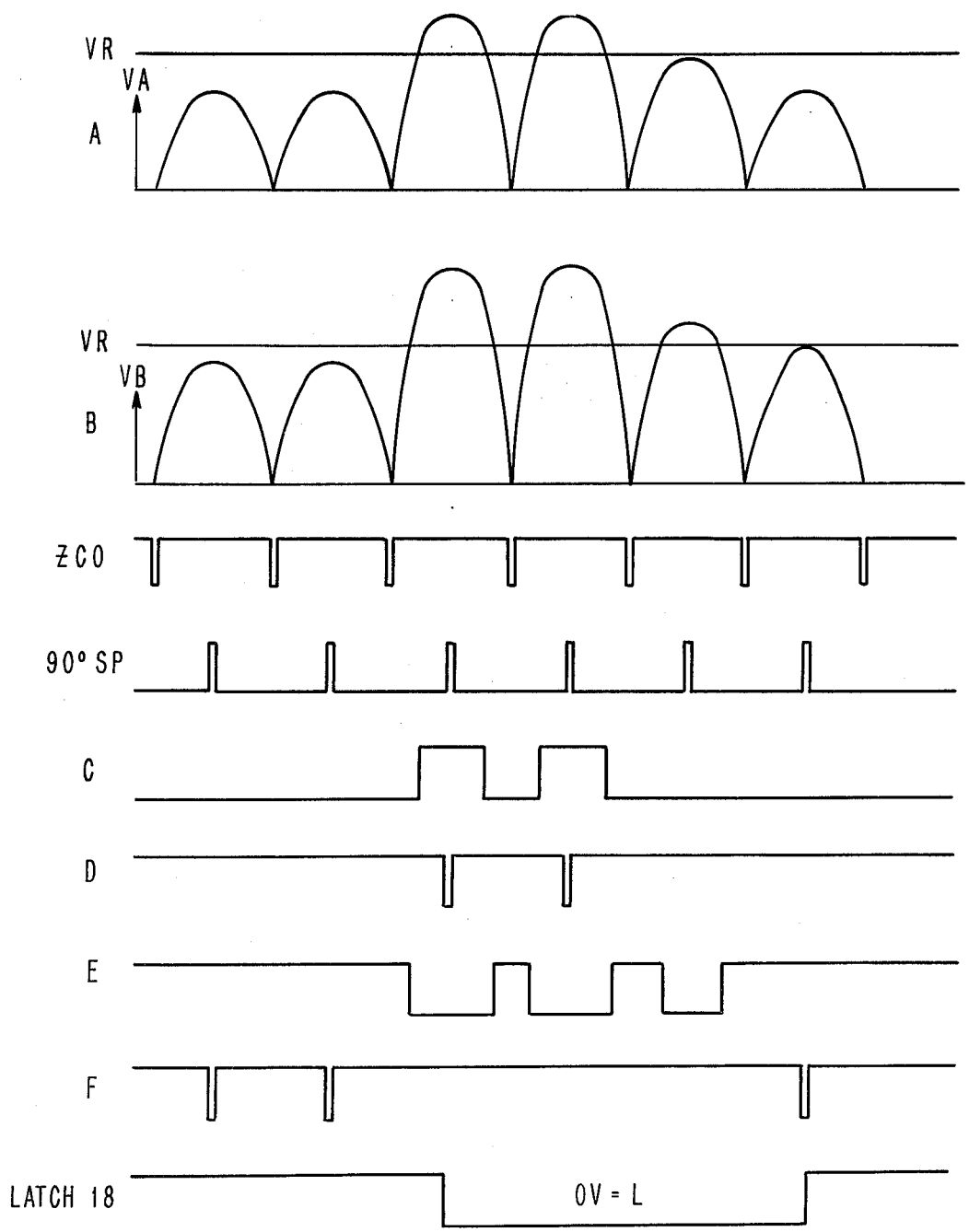

Similarly, comparator 68 receives the over-voltage reference input from the digital-to-analog converter 63 as an input, but at the non-inverting terminal (+). The input waveform being monitored after being rectified by diodes 50 and 52 and divided down by resistors 66 and 69 is applied to the minus terminal of comparator 68. It should be noted that the resistor 66 has a lower value than the resistor 65. Thus, the voltage applied to the minus terminal of comparator 68 is larger than that applied to the plus terminal of comparator 62, the difference being determined by the difference in resistor values. This difference can best be seen in waveform A and waveform B of FIG. 3. The reference $V_R$ is the same on both waveforms and the difference in voltage level of the waveform being monitored is shown by the higher voltage $V_B$ of waveform B than the voltage $V_A$ of waveform A. The important thing to note here is that the waveform A exceeds the reference $V_R$ at the third and fourth cycle. This means that the polarity shown on comparator 62 is obtained when the third and fourth cycle of the voltage being monitored exceed the reference $V_R$ and, accordingly, comparator 62 produces an output at both these times as represented by the waveform C. The 90° strobe pulse previously obtained is applied as one input to each of NAND gates 70 and 71. If the output from comparator 62 is an up-level, indicating that the voltage $V_A$ is above the threshold $V_R$, and the strobe pulse is present, output pulses are produced as shown on waveform D in FIG. 3. These pulses cause a latching or setting of the interrupt latch 18. The resetting is accomplished by the coincidence of an up level output from comparator 68 and the 90° strobe pulse. As can be seen from waveform B and waveform E, the polarity shown for comparator 68 is obtained and is denoted by the up-level of waveform E. When the polarity changes, that is the voltage $V_B$ of the waveform B goes above the voltage reference $V_R$, a down-level is obtained as indicated in waveform E on FIG. 3 for the cycles 3, 4 and 5. The NAND gate 71 produces an output pulse (waveform F) each time a strobe pulse is received coincident with the up-level output from comparator 68. These pulses are applied to the reset terminal of latch 18 but have no effect unless the latch is in the set condition. The different voltage levels of waveforms A and B determine a different threshold reset. For example, the fifth cycle of waveform A has dropped below the over-voltage reference $V_R$ and in the prior art would cause a reset of the interrupt latch. However, in the two comparator arrangement as described above, the voltage $V_B$ of the fifth cycle of waveform B is still above the voltage reference $V_R$ and accordingly, does not cause the reset until the over-voltage has improved by an amount determined by the voltage differential between the inputs to the two comparators. Thus, the reset is obtained at the time of the next strobe pulse which is coincident with a voltage peak $V_B$ which is below the reference $V_R$. In the case shown in waveform B, FIG. 3, this would be the sixth cycle. This built-in reset differential or hysteresis prevents threshold indecision caused when the reset is at the same threshold as the setting threshold. The output from latch 18 representing an over-voltage is applied to NAND gate 20. The latch outputs representing over-voltage from similar detectors for phase 2 and 3 are gated with the phase 1 input at NAND gate 20. The output of NAND gate 20 representing an over-voltage from any phase is connected to a NOR gate 22.

Figure 4:
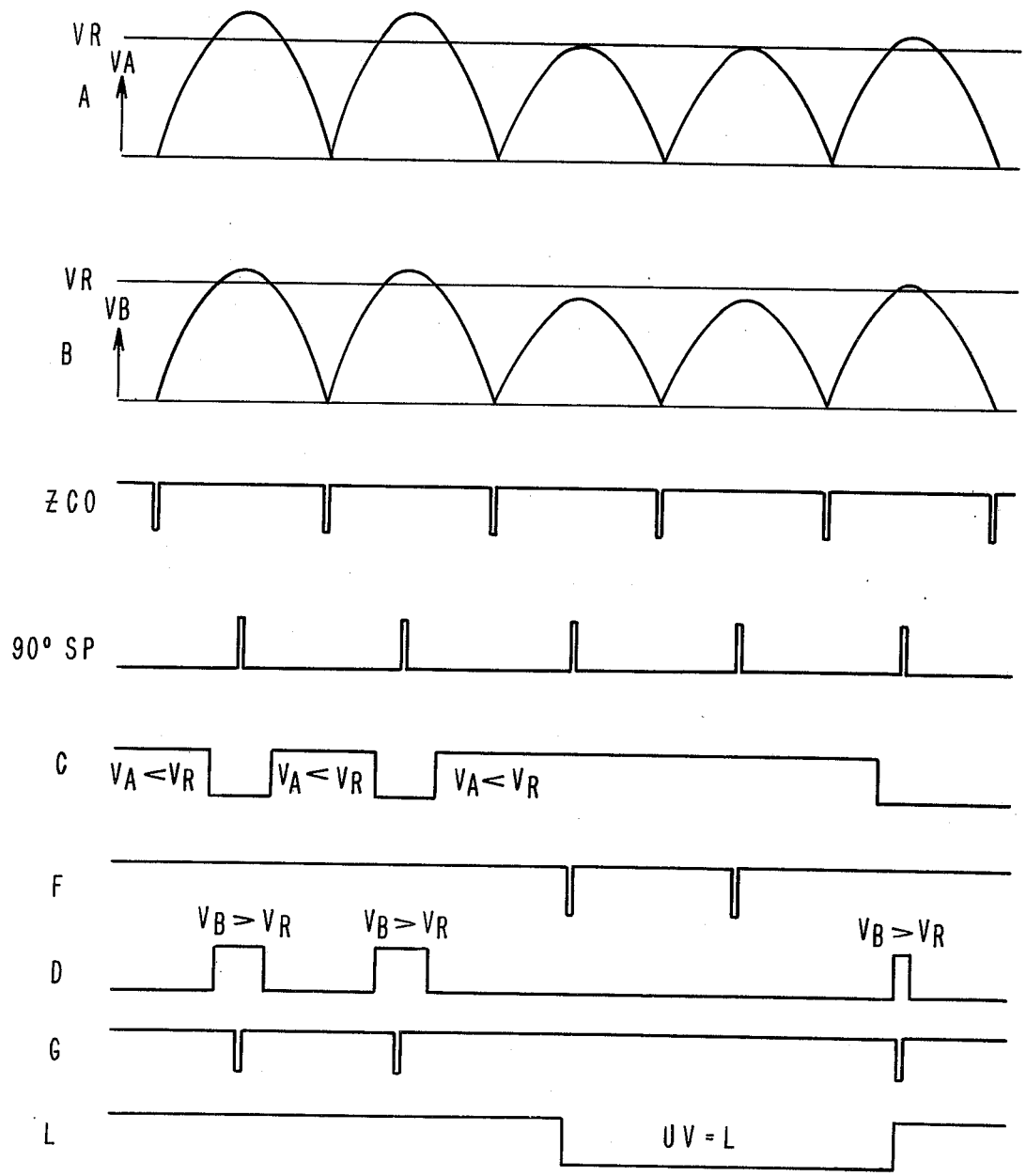
FIG. 4 is a schematic representation showing the waveforms associated with the under-voltage, peak-voltage sensor of FIG. 2b.

The under-voltage, peak-voltage sensor 24 operates on the same principle as that given for the over-voltage, peak-voltage sensor 14. The sinewave to be monitored is full wave rectified in diodes 50 and 52 and is divided down by resistors 76 and 81 and applied to the inverting (−) terminal of comparator 78. The same rectified sinusoidal varying voltage is applied to the plus terminal of comparator 79 after being divided down by precision resistors 80 and 83. The capacitors 76a and 80a filter out high frequency noise. The voltage differential or hysteresis is obtained from the different values of the resistors in the resistive divider network in the comparator input lines. For example, resistor 81 in the input line to the minus terminal of comparator 78 is 10.2 k ohms whereas the resistor in the input line to the plus terminal of comparator 79 is 10.7 k ohms. The smaller resistor resulting in the larger voltage as can be seen by a comparison of the waveforms A and B as shown in FIG. 4. The under-voltage reference is obtained from a digital-to-analog converter 82 which accepts the under-voltage reference in digital form and converts it to a corresponding analog voltage reference level. This voltage reference level is applied to the plus terminal of comparator 78 and to the minus terminal of comparator 79. Keeping in mind the above-described operational characteristics of the comparators, that is, that an up-level or positive output will be obtained from a comparator when the actual voltage input relation corresponds to the polarity as indicated on the comparator. In the case of comparator 78, an up output will be obtained when the voltage being monitored goes below the reference voltage level. When the voltage being monitored goes above the reference voltage in comparator 79 an up output is produced.

To aid in the understanding of the operation of these comparators the characteristic waveforms are shown in FIG. 4. Threshold $V_R$ is established by the under-voltage reference and, accordingly, comparator 78 produces an up-level, see waveform C, as long as the voltage $V_A$ being monitored is below the reference voltage $V_R$, that is, $V_A$ is less than $V_R$. As soon as the polarity changes, that is, when $V_A$ is larger than $V_R$ a negative output is obtained. Accordingly, where $V_A$ goes below $V_R$ as can be seen in the third and fourth cycle, the output waveform C should then be at the positive or up-level. At the time of the strobe pulse and the up-condition of the output from comparator 78, output waveform F is obtained which is a negative pulse due to the inverting caused by the NAND circuit 84. These waveform F output pulses are used to set latch 28. The reset comparator 79, as mentioned previously, receives the input voltage wave being monitored at the positive terminal and the under-voltage reference voltage at the minus terminal. As long as $V_B$ is smaller than the reference $V_R$ a down level exists at the output of comparator 79, as can be seen in waveform D. When $V_B$ exceeds the threshold reference value $V_R$, a positive output is obtained. The positive pulses shown in waveform D correspond to those voltage peaks which go above the $V_R$ reference. The coincidence of the 90° strobe pulses and the positive output pulses from the comparator 79 are ANDed together at NAND circuit 86 which gives an inverted output shown in waveform G. These pulses are used to reset the latch 28. If latch 28 is already in the reset state these pulses have no effect. In the example shown by the waveforms in FIG. 4, the latch is set by the first negative pulse of waveform F and is not reset until the last negative pulse of waveform G. The latch output when in set status, is represented as a down-level waveform L. This latch output is gated through NAND circuit 30, which because of its inverting characteristic gives an up-level latch signal to NOR circuit 22 which also provides an inverted output, that is a low or down-level output which represents the interrupt. It should be noted that phases 2 and 3 of the 3 phase power input are also connected to NAND circuit 30. An under-voltage condition on any one of the three phases produces the under-voltage interrupt signal.

Figure 2B:
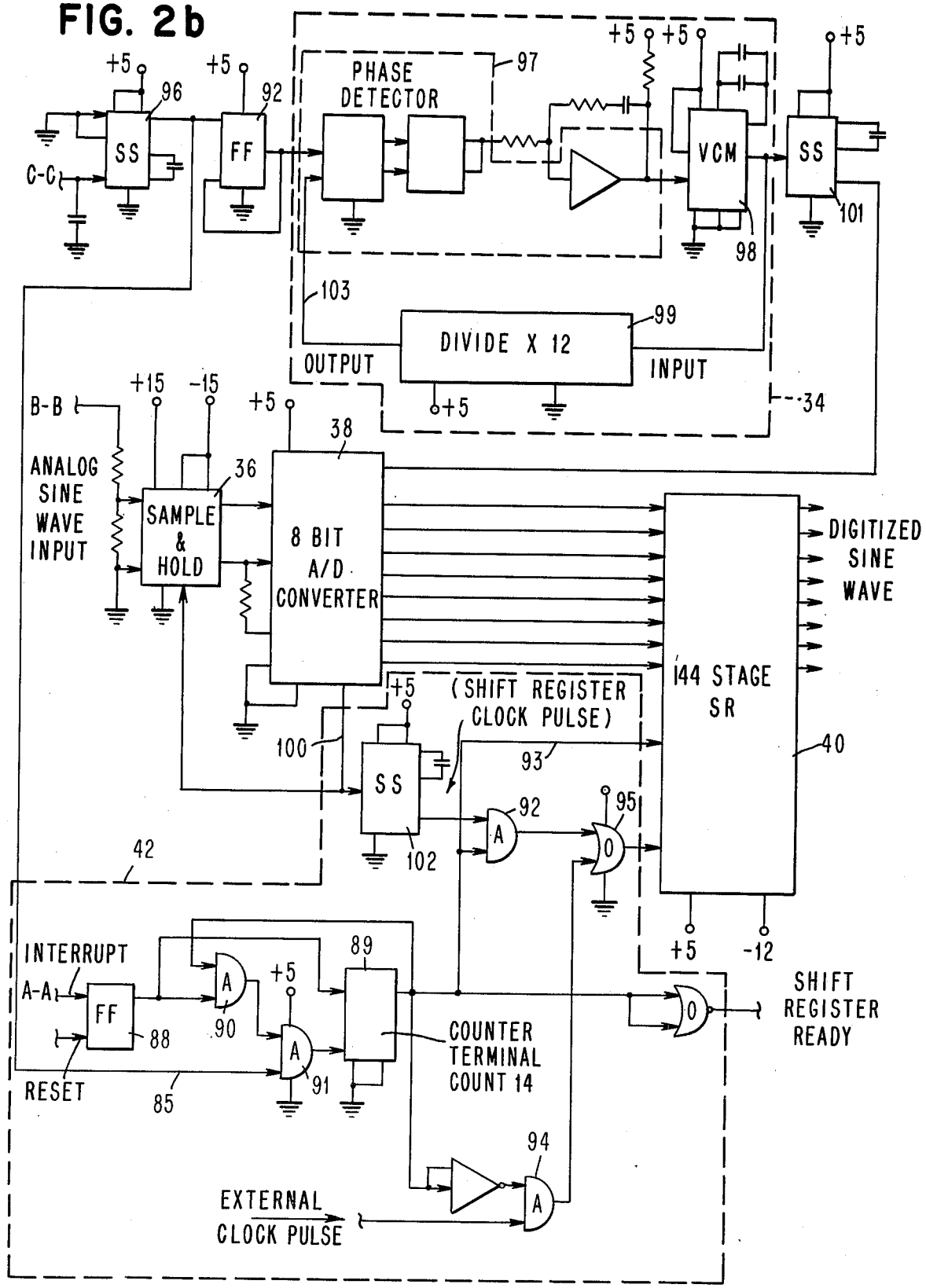

Twelve cycles of sinewave information in digital form are stored in a 144 stage long, 8 shift bit wide register 40. This digital information is placed in the shift register by an eight bit analog-to-digital converter 38 which monitors the sinewave input every 30° and converts it to an eight bit digital word which is sent to the shift register 40. Every 30° a new word enters the shift register 40 and, accordingly, on word exits. Therefore, the information exiting the shift register is always twelve cycles old or delayed by the time it takes for the 144 stages to shift the data. After each conversion of A/D converter 38 a down level end-of-convert signal is produced on output line 100. The negative transition of this output triggers single shot 102 which forms the clock pulse for shift register 40. Output 100 also connects to the sample and hold block 36 to provide control signals. The analog sinewave is obtained from the transformer T1 shown in FIG. 2a. This input is identified as B—B on FIG. 2b. The analog sinewave is placed in a sample and hold circuit 36. The sample voltages are applied to the eight bit analog-to-digital converter 38 where the voltages are converted to digital information which, as previously mentioned, is sent to the shift register 40. When the interrupt signal identified as A—A in FIG. 2b is received from the output of NOR circuit 22, flip-flop 88 is set which gates ZCO clock pulses to counter 89. The ZCO pulse identified as C—C are connected through SS96 to AND circuit 91 via connector 85. The up-level output of the flip-flop 88 is ANDed in AND gate 90 with the normally up output of the counter 89 to produce an input to AND gate 91 which, when coincident with the positive zero-cross-over pulses, conditions AND gate 91 and increments counter 89. The counter is pulsed twice per cycle and reaches terminal count 7 cycles later. Upon reaching terminal count, the counter 89 output switches low. The outputs of AND gates 90 and 91 swich low and inhibit clock pulses to counter 89. The low output of counter 89 inhibits AND gate 92 and stops clock pulses to OR gate 95 and the shift register 40. Simultaneous therewith this output from the counter 89 at the terminal count places the shift register into the recirculate mode via the connection 93. During this recirculate state the clock pulses are obtained from an external clock pulse source and applied to AND gate 94. These are gated with the inverse of the counter output pulse and are fed to the shift register via the OR circuit 95 to produce the shifting required for continual playback of the twelve cycles of stored information in shift register 40. This stored information of course includes five cycles of normal line voltage information and the seven cycles following the interrupt. A reset applied to flip-flop 88 resets counter 89 which again places the shift register into a normal operating mode, that is, one where the clock pulses are continually received from OR circuit 95 under control of the eight bit analog-to-digital circuit and single shot 102.

The zero-cross-over pulses identified as C—C are connected into a single shot 96 for pulse shaping from whence they are connected into the control for the counter 89. In addition, these zero-cross-over pulses trigger flip-flop 92 the output of which is a square wave having a frequency equal to line frequency and which is connected to phase detector 97 in phase locked loop 34. The phase detector 97 compares the phase of the input signal from flip-flop 92 with a feedback signal on line 103 from the output of a voltage controlled oscillator or multivibrator. The feedback includes a divide by 12 counter 99. The comparison in the phase detector 97 between FF92 and divide X12 counter 99 outputs is transformed into an error voltage representative of the phase difference which, accordingly, locks oscillator 98 to a frequency twelve times the line frequency. Thus, we have an output from the VCM 98 which is exactly twelve times the frequency of the square wave output of flip-flop 92. The output of the VCM 98 is fed back to the phase detector 97 as one of the inputs thereto through a counter 99. The counter 99 gives an output pulse for every 12 input pulses. In other words, the counter 99 divides by 12. The output from the voltage controlled multivibrator 98, triggers SS 101 which forms the enabling pulses which are sent to the eight bit analog-to-digital converter 38 to enable it to sample the input every 30° or twelve times per cycle. Upon generating an over-voltage or under-voltage interrupt on phase A of the power line input, the digital information representative of the waveform is stored in shift register 40 such that there are five cycles of information preceeding the interrupt and seven cycles of information following the interrupt. This information is valuable for diagnostic purposes, especially where the input power is being utilized to drive data processing equipment. There is a shift register and associated control circuitry for each phase of the power line input. In other words, FIG. 2b is repeated for each phase.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A utility monitor for detecting and storing power line disturbances comprising:
   transformer means for coupling a sinewave voltage from the power lines;
   a timing means generator connected to said transformer means for generating zero crossover pulses and strobe pulses for timing and sampling the input sinewave voltage, respectively;
   a first and second pair of comparators coupled to said transformer means for sensing an over-voltage and an under-voltage, respectively;
   a first and second reference voltage connected to an input of each comparator of said first and second pair of comparators respectively;
   a voltage divider located in each input line connected to the other input of each comparator of said first and second pair of comparators for modifying said input sinewave voltage to a difference voltage for each of said other inputs of said comparators of said first and second pair of comparators;

said first pair of comparators providing a set and reset output when the modified input sinewave voltage exceeds and drops below said reference voltage respectively;

said second pair of comparators providing a set and reset output when the modified input sinewave voltage drops below and exceeds said reference voltage respectively, the set and reset output from each pair of comparators being separated at least by the difference in voltage provided by said voltage divider and obtaining an interrupt signal at the time of said strobe pulse indicative of an input voltage rise above or below respective threshold values;

and means for storing a preselected number of cyclic variations of said input sinewave voltage before and after said interrupt output.

2. A utility monitor for detecting and storing power line disturbances according to claim 1, wherein the power line contains multi-phases of sine wave voltage and a plurality of detecting means for obtaining an interrupt, one for each phase of said power line and a plurality of means for storing a preselected number of cycles of said input sine wave voltage before and after said interrupt output, one for each phase of said multi-phases of sine wave voltage.

3. A utility monitor according to claim 1, wherein said timing means generator for generating strobe pulses includes a zero-cross-over pulse producing means for producing a narrow pulse each time the sine wave voltage input crosses the zero axis and a 90° strobe pulse generator which delays the zero-cross-over pulse by a time equal to 90° so that said strobe pulse occurs at the peak of said sine wave voltage.

4. A utility monitor according to claim 1, wherein said first and second reference voltages are obtained from first and second digital-to-analog converters respectively.

5. A utility monitor according to claim 1, wherein said means for storing a preselected number of cycles of said input sinewave voltage before and after detecting a power line disturbance includes a multi-word shift register.

6. A utility monitor according to claim 5, wherein said sine wave input is sampled and held, and an analog-to-digital converter converts the sine wave into a digital word at each preset number of degrees and transfers said digital word to said shift register.

7. A utility monitor according to claim 6, wherein a phase locked loop including a voltage controlled oscillator is utilized to increase the frequency of said zero-cross-over pulses to a higher frequency of pulses needed to operate said analog-to-digital converter and said shift register and to synchronize and lock in the higher frequency to the line frequency.

8. A utility monitor according to claim 7, wherein a counter is provided having a terminal count which is less than the number of cycles of voltage stored in said shift register, said counter starting upon receiving an over-voltage or under-voltage interrupt signal from said first and second pairs of comparators and stopping at said terminal count to stop the shift register clock pulses and place the shift register in the recirculate standby mode thereby providing digitized sinewave voltage information before and after the over-voltage or under-voltage interrupt signal.

* * * * *